(12) United States Patent
Sakurai et al.

(10) Patent No.: US 10,401,579 B2
(45) Date of Patent: Sep. 3, 2019

(54) DETECTION DEVICE AND MANUFACTURING METHOD OF DETECTION DEVICE

(71) Applicant: Santec Corporation, Aichi (JP)

(72) Inventors: Yasuki Sakurai, Aichi (JP); Shinichiro Asada, Aichi (JP)

(73) Assignee: Santec Corporation, Aichi (JP)

( * ) Notice: Subject to any disclaimer, the term of this patent is extended or adjusted under 35 U.S.C. 154(b) by 0 days.

(21) Appl. No.: 15/669,382

(22) Filed: Aug. 4, 2017

(65) Prior Publication Data

US 2018/0039031 A1 Feb. 8, 2018

(30) Foreign Application Priority Data

Aug. 5, 2016 (JP) ................................ 2016-154775

(51) Int. Cl.
G02B 6/42 (2006.01)
G02B 6/38 (2006.01)

(52) U.S. Cl.
CPC .......... *G02B 6/4204* (2013.01); *G02B 6/3845* (2013.01)

(58) Field of Classification Search
CPC ...... H04B 10/077; H04B 10/08; H04B 10/40; G02B 6/3845; G02B 6/4204; G02B 6/10; G02B 6/26; G02B 6/42; G02B 6/32; G02B 6/34; H01L 31/0232; H01S 3/00; H04J 14/0257; H04J 14/026; H04J 14/0267; H04J 14/0278
USPC .............................................. 398/25; 385/48
See application file for complete search history.

(56) References Cited

U.S. PATENT DOCUMENTS

| | | | | |
|---|---|---|---|---|
| 5,324,954 A * | 6/1994 | Oikawa | ................ | G02B 6/4204 250/227.24 |
| 6,346,701 B1 * | 2/2002 | Maruyama | ................ | G01J 1/04 250/216 |
| 6,545,256 B1 * | 4/2003 | Ishizu | ................ | G01T 1/20 250/206.1 |
| 6,603,906 B2 * | 8/2003 | Qin | ................ | G02B 6/4204 385/48 |
| 6,700,664 B1 * | 3/2004 | Honda | ................ | G01J 3/02 250/226 |
| 6,922,281 B2 * | 7/2005 | Pan | ................ | G02B 6/4201 359/341.1 |
| 6,970,252 B2 * | 11/2005 | Knuttel | ................ | G01B 11/2441 356/497 |
| 7,044,660 B2 * | 5/2006 | Pan | ................ | G02B 6/4201 359/341.3 |
| 7,130,121 B2 * | 10/2006 | Pan | ................ | G02B 6/4201 359/484.04 |
| 7,238,935 B2 | 7/2007 | Asada et al. | | |

(Continued)

OTHER PUBLICATIONS

Office Action issued in corresponding U.S. Appl. No. 16/108,441 dated Jan. 14, 2019 (16 pages).

*Primary Examiner* — Abbas H Alagheband
(74) *Attorney, Agent, or Firm* — Osha Liang LLP

(57) ABSTRACT

A detection device for detecting a power of an input light is provided with a light-receiving module that outputs an electrical signal according to a power of an input light received at a light-receiving surface and an optical system that collimates and guides to the light-receiving surface the input light from the outside. Moreover, this detection device is provided with a structure that decreases an incidence angle of the input light at an interface between the optical system and the light-receiving surface.

3 Claims, 7 Drawing Sheets

(56) References Cited

U.S. PATENT DOCUMENTS

| | | | |
|---|---|---|---|
| 7,421,161 B2* | 9/2008 | Furuichi | G02B 6/327 |
| | | | 385/33 |
| 8,194,182 B2* | 6/2012 | Kinoshita | G03B 17/00 |
| | | | 348/374 |
| 8,987,655 B2* | 3/2015 | Sasada | G02B 6/4206 |
| | | | 250/214.1 |
| 9,083,137 B2* | 7/2015 | Hayashi | H01S 5/02248 |
| 2003/0021537 A1 | 1/2003 | Qin et al. | |
| 2003/0081901 A1 | 5/2003 | Gage et al. | |
| 2003/0113072 A1* | 6/2003 | Ohe | G02B 6/4204 |
| | | | 385/88 |
| 2004/0131004 A1 | 7/2004 | Mimori et al. | |
| 2006/0065817 A1 | 3/2006 | Asada et al. | |
| 2007/0183716 A1* | 8/2007 | Suzuki | G02B 6/262 |
| | | | 385/33 |
| 2009/0065685 A1* | 3/2009 | Watanabe | G01J 1/04 |
| | | | 250/237 R |
| 2009/0103867 A1* | 4/2009 | Huang | G02B 6/26 |
| | | | 385/48 |
| 2013/0161497 A1* | 6/2013 | Sasada | G02B 6/4206 |
| | | | 250/227.23 |
| 2017/0063485 A1* | 3/2017 | Lee | G02B 6/00 |
| 2018/0026426 A1* | 1/2018 | Kawakita | G02B 5/284 |
| | | | 372/20 |

* cited by examiner

DETECTION DEVICE AND MANUFACTURING METHOD OF DETECTION DEVICE

FIELD

The present disclosure relates to a device for detecting a power of a light and a manufacturing method thereof.

BACKGROUND

To monitor an optical communication operation in an optical communication network, the optical communication network is provided with an optical power monitor (for example, see patent literature 1). The optical power monitor is, for example, built into an optical communication device, detects a power of an optical communication signal, and provides information on the detected power to a controller in the optical communication device.

Included as one example of the optical communication network is a WDM (wavelength-division multiplexing) network. At a branching point of the WDM network, for example, as the optical communication device, a ROADM device is disposed. The ROADM device is provided with an optical switch for switching the optical communication signal to any path and/or branching/inserting the optical communication signal. The optical power monitor is, for example, mounted to this ROADM device and is used to control an optical amplifier in the ROADM device and transmit the optical communication signal at an optimal power. Additionally, the optical power monitor is also used in an optical communication device such as an optical transceiver or an optical transponder that sends/receives an optical communication signal to control and/or monitor the power of the optical communication signal.

CITATION LIST

Patent Literature

[Patent Literature 1] US2003/0021537 A1

As is obvious, with a detection device, one example thereof being the optical power monitor above, being able to detect a power with high precision is possible. However, because a conventional device is affected by a difference in transmittance between s-polarized light and p-polarized light, in relation to a light whose polarized state is not established, the power cannot be detected with precision.

SUMMARY

One or more embodiments of the present invention provide a device that can suppress effects of a polarized state and detect a power of a light with high precision.

A detection device according to one aspect of the present disclosure is a detection device for detecting a power of an input light and is provided with a light-receiving module and an optical system. The light-receiving module is configured to have a light-receiving surface and output an electrical signal according to a power of the input light received at the light-receiving surface. The optical system is configured to collimate and guide to the light-receiving surface the input light from the outside. Moreover, this detection device is provided with a structure that decreases an incidence angle of the input light at an interface between the optical system and the light-receiving surface to be no more than 30 degrees.

In an environment where a polarized state is not established, a component ratio between an s-polarized light and a p-polarized light included in the input light fluctuates. Meanwhile, transmittances of the s-polarized light and the p-polarized light at the interface are not the same, and a difference exists. Conventionally, due to this difference in transmittance, in an environment where a polarized state of the input light is not established—in other words, an environment where the component ratio between the s-polarized light and the p-polarized light fluctuates—the power of the input light cannot be detected with precision. That is, a large error arises in the detected power in conjunction with the fluctuation in the component ratio.

This difference in transmittance between the s-polarized light and the p-polarized light becomes smaller the smaller the incidence angle of the light at the interface becomes and becomes greater the greater the incidence angle becomes. Moreover, the difference in transmittance is exponential relative to the incidence angle.

According to one aspect of the present disclosure, to suppress a detection error in the power caused by the difference in transmittance described above, provided is a structure that decreases the incidence angle of the input light at the interface to be no more than 30 degrees. Therefore, a detection device according to one aspect of the present disclosure can detect the power of the light with higher precision than a conventional device. Such an adjustment of the incidence angle can be realized by, for example, adjusting a shape of the interface and/or adding an optical component for angle adjustment.

According to one aspect of the present disclosure, as the light-receiving module above, the detection device may be provided with a light-receiving module configured to have a light-receiving surface and a transparent covering body covering the light-receiving surface; receive the input light, which arrives via the covering body, at the light-receiving surface; and output the electrical signal according to the power of the received input light. The detection device may be made to be of a configuration where, as the optical system above, provided is an optical lens configured to collimate and guide to the light-receiving surface the input light from the outside.

In this situation, as the covering body above, the detection device can be provided with a covering body shaped so an incidence angle of the input light at a surface thereof becomes no more than 30 degrees. Such a surface shape of the covering body corresponds to an example of the structure that decreases the incidence angle of the input light to be no more than 30 degrees.

According to one aspect of the present disclosure, provided may be a detection device provided with a light-receiving module configured to have a light-receiving surface and output an electrical signal according to a power of an input light received at the light-receiving surface, an optical lens configured to collimate and guide to the light-receiving surface the input light from the outside, and at least one optical component disposed to decrease an incidence angle of the input light at an interface between the optical lens and the light-receiving module. This optical component may be disposed to decrease the incidence angle to be no more than 30 degrees but does not have to be disposed thus. It is sufficient for the optical component to be disposed so the incidence angle is decreased compared to a situation where there is no optical component. This disposition brings about an effect of improved detection precision.

According to one aspect of the present disclosure, as the light-receiving module, the detection device provided with the optical component above may be provided with a light-receiving module configured to have a transparent covering body covering the light-receiving surface and receive the input light, which arrives via the covering body, at the light-receiving surface. In this situation, as the optical component above, the detection device can be provided with an optical component disposed to decrease an incidence angle of the input light at a surface of the covering body. This optical component can be, for example, a prism disposed in a path of the input light between the optical lens and the covering body.

Furthermore, the configuration described above can be applied to a detection device that detects a power of an optical communication signal. In this situation, the detection device can be made to be of a configuration provided with an optical fiber pigtail including two optical fibers connected to an optical transmission line through which the optical communication signal is transmitted. The optical lens can be configured to collimate the input light from one end of an input fiber, which is one of the two optical fibers, and separate this input light into a transmitted light and a reflected light, guiding the transmitted light to the light-receiving surface and guiding the reflected light to an output fiber, which is the other of the two optical fibers. The light-receiving module can be configured to output the electrical signal according to the power of the input light that is the input light from the optical transmission line via the input fiber and received at the light-receiving surface. High-precision power detection of the optical communication signal is useful in constructing and/or managing an appropriate optical communication network.

According to one aspect of the present disclosure, the detection device may be made to be of a configuration provided with a light-receiving module that is a light-receiving module and includes a light-receiving element, a support body that supports the light-receiving element, and a transparent covering body that covers the light-receiving element on the support body and an optical lens that collimates and guides to a light-receiving surface of the light-receiving element an input light from the outside. As a manufacturing method of this detection device, provided may be a manufacturing method of a detection device that is a procedure of coating a potting material on the light-receiving element on the support body to form the coating body, including the step of forming the covering body, whose surface is shaped so an incidence angle of the input light to the covering body becomes no more than 30 degrees, by coating a plurality of layers of the potting material.

DETAILED DESCRIPTION

Figure 1:
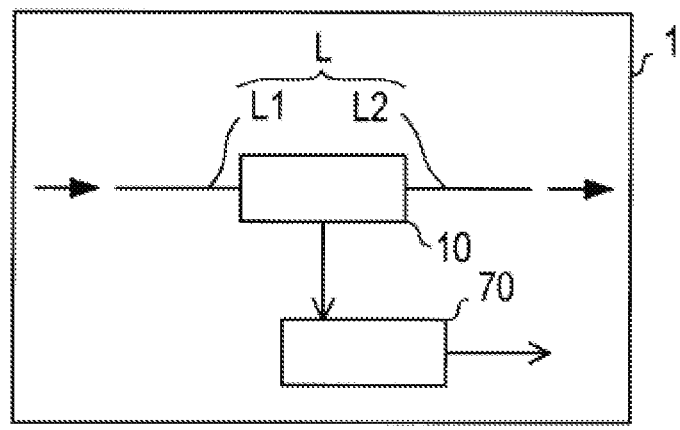
FIG. 1 A block diagram representing a schematic configuration of an optical communication device including a photodetector according to one or more embodiments.

Illustrative embodiments of the present invention are described below with reference to the drawings. An optical communication device 1 of one or more embodiments illustrated in FIG. 1 is provided with a tapped photodetector 10 connected to an optical transmission line L. In FIG. 1, an optical communication device 1 provided with a single photodetector 10 is illustrated. However, the optical communication device 1 may be a multiport communication device and may be made to be of a configuration where a photodetector 10 is provided to each transmission line at the ports. The optical communication device 1 can be any device from among, for example, a sending device, a receiving device, and a relay device in an optical communication network. The optical communication device 1 may be a management/monitoring device connected to the optical communication network for management and/or monitoring purposes.

The photodetector 10 detects a power of an input light from the optical transmission line L and inputs to a controller 70 in the optical communication device 1 an electrical signal according to this power as a detection signal. The input light can be any signal from among an optical communication signal received by the optical communication device 1 from an external device, an optical communication signal sent by the optical communication device 1 to an external device, and a transfer signal in a situation where the optical communication device 1 is a repeater such as a ROADM device.

Figure 2:
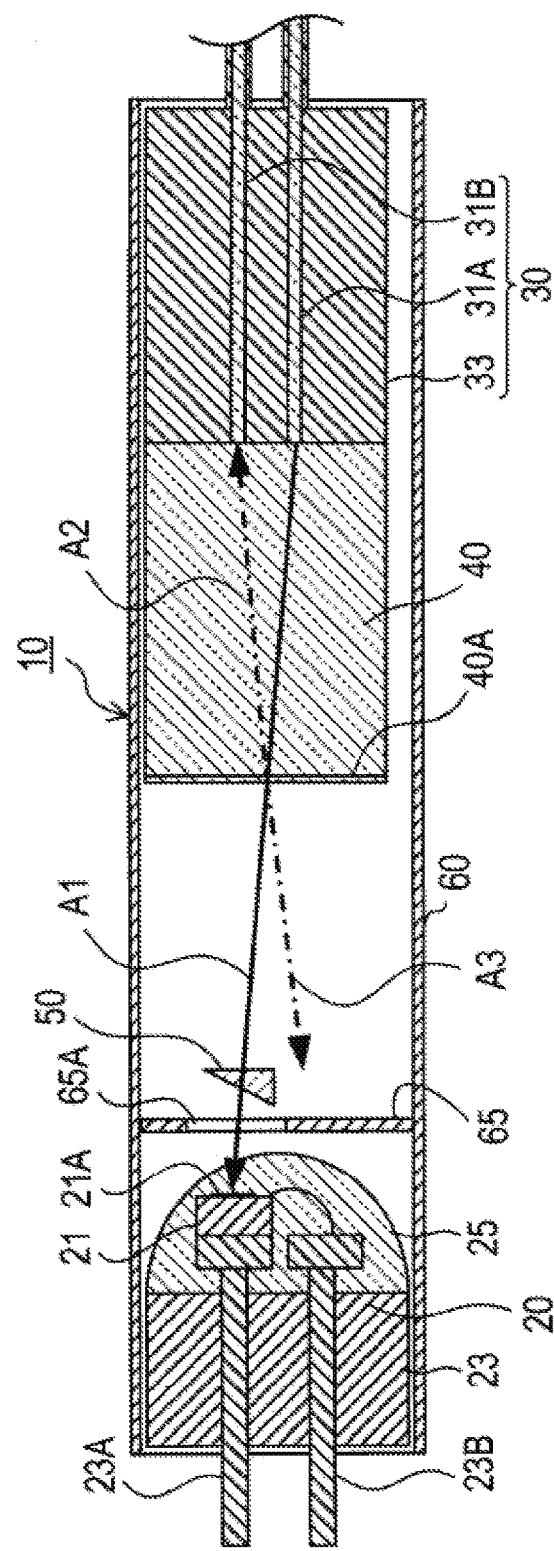
FIG. 2 A diagram schematically representing a cross-sectional structure at a centerline of the photodetector according to one or more embodiments.

The photodetector 10 is configured, for example, as illustrated in FIG. 2. The photodetector 10 illustrated in FIG. 2 is principally provided with a PD module 20, an optical fiber pigtail 30, a GRIN lens 40, a prism 50, and a tubular case 60 that holds these. In this photodetector 10, the PD module 20, the optical fiber pigtail 30, and the GRIN lens 40 are arranged along a centerline of the tubular case 60.

Figure 3:
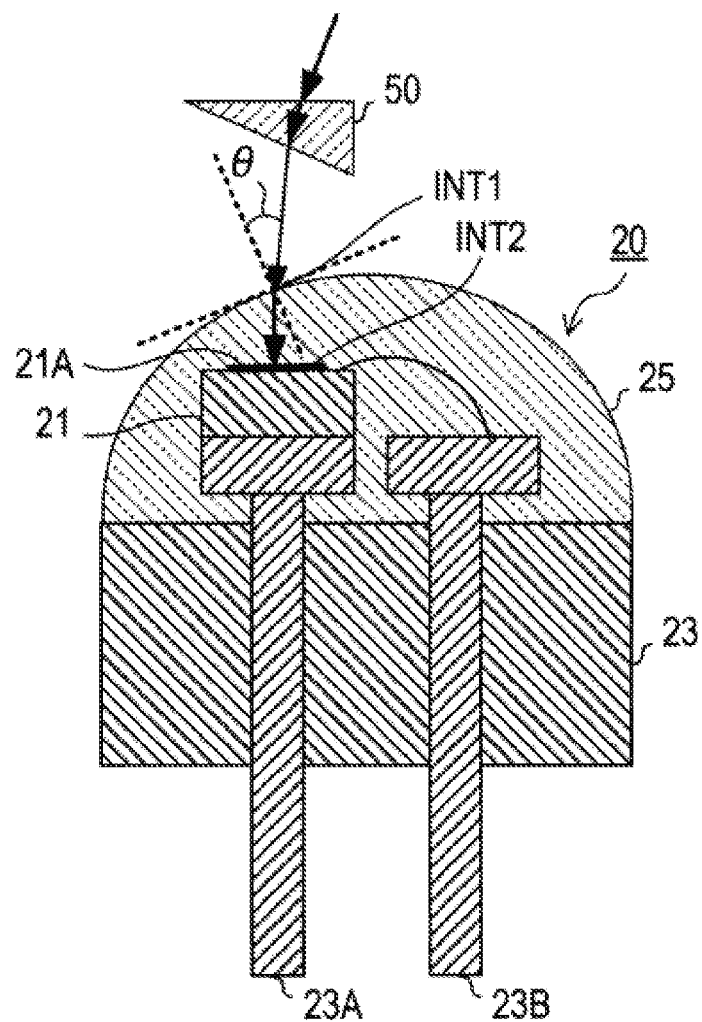
FIG. 3 A cross-sectional view representing a schematic configuration of a vicinity of a PD module according to one or more embodiments.

As illustrated in FIG. 2 and FIG. 3, the PD module 20 is provided with a photodiode (PD) chip 21 as a light-receiving element, a cylindrical stem 23 that supports the PD chip 21, and a transparent resin layer 25 that covers and protects the PD chip 21. The stem 23 is provided with a pair of conductive electrode pins 23A, 23B penetrating the stem 23 from a front surface thereof to a rear surface thereof.

A top portion of the electrode pin 23A has the PD chip 21 mounted thereon, and a top portion of the electrode pin 23B is wire-bonded to the PD chip 21. Specifically, the electrode pin 23A is electrically connected to a cathode electrode formed on a rear surface of the PD chip 21, and the electrode pin 23B is electrically connected to an anode electrode formed on a front surface of the PD chip 21. That is, the electrode pins 23A, 23B function as lead lines from the PD chip 21 and function as a feeder to the PD chip 21 and a signal line from the PD chip 21.

These electrode pins 23A, 23B are connected to the controller 70. The controller 70 executes predetermined processing based on the detection signal of the power input from the PD chip 21 via these electrode pins 23A, 23B. Included as examples of the processing are processing that adjusts a gain of an optical amplifier and processing that displays a detection value of the power.

The PD chip 21 is provided with a light-receiving surface 21A in a front-surface central portion facing a GRIN-lens 40 side, provided with an anode electrode that is not illustrated in a front-surface corner portion thereof, and provided with a cathode electrode that is not illustrated on a rear surface thereof. This PD chip 21 inputs to the controller 70 the electrical signal according to a received light quantity (received optical power) at the light-receiving surface 21A as the detection signal via the electrode pins 23A, 23B of the stem 23.

Furthermore, the transparent resin layer 25 is formed by potting. That is, the transparent resin layer 25 is formed by a potting material being coated and cured on the stem 23 and the PD chip 21 in a state where the PD chip 21 is mounted on the electrode pin 23A in the stem 23.

Additionally, the optical fiber pigtail 30 is provided with two optical fibers 31A, 31B connected to the optical transmission line L and a two-core capillary 33 wherein the optical fibers 31A, 31B are inserted. In the capillary 33, the optical fibers 31A, 31B are disposed in parallel along an axis of the capillary 33. Specifically, the optical fibers 31A, 31B are disposed in parallel slightly away from each other in opposing directions from a center of the capillary 33. The two-core capillary 33 supports one end of the optical fibers 31A, 31B disposed in this manner.

The optical fiber 31A, which is one of these two optical fibers 31A, 31B, is used as an input fiber 31A for inputting the optical communication signal whose power is to be detected by the photodetector 10. The other optical fiber 31B is used as an output fiber 31B for returning the optical communication signal to the optical transmission line L.

An end portion on an opposite side of the end portion supported by the capillary 33 of the optical fibers 31A, 31B is connected to the optical transmission line L via a connector that is not illustrated. Specifically, the input fiber 31A is connected, within the optical transmission line L, to an optical transmission line L1 positioned upstream, in a transmission direction, of the photodetector 10 and the output fiber 31B is connected, within the optical transmission line L, to an optical transmission line L2 positioned downstream, in the transmission direction, of the photodetector 10.

The GRIN lens 40 is disposed adjacent to the capillary 33. The light from the input optical fiber 31A supported by the capillary 33 is input to the GRIN lens 40 disposed in this manner. The GRIN lens 40 is configured to collimate the input light and guide this collimated light to the light-receiving surface 21A of the PD module 20.

The GRIN lens 40 has a branching membrane 40A on an end surface facing a light-receiving-surface 21A side of the PD module 20. The branching membrane 40A separates the light from the input fiber 31A arriving via a main body of the GRIN lens 40 into a transmitted light and a reflected light. As the branching membrane 40A, a branching membrane is selected where a light-quantity ratio between transmitted light and reflected light becomes a predetermined ratio. A ratio of the transmitted light is, for example, no more than 1% of the input light.

By being provided with this branching membrane 40A, the GRIN lens 40 guides a portion of the input light from the input fiber 31A (transmitted light) to the light-receiving surface 21A of the PD module 20. Moreover, the GRIN lens 40 guides a reflected-light component of the input light separated by the branching membrane 40A to the output fiber 31B. The reflected-light component is condensed in a path in the GRIN lens 40 leading to the output fiber 31B and is input to the output fiber 31B.

Arrow A1 illustrated by a solid line in FIG. 2 schematically illustrates a path of the transmitted light, propagated to the light-receiving surface 21A, among the input light from the input fiber 31A. Arrow A2 illustrated by a dot-dash line in FIG. 2 schematically illustrates a path of the reflected light from the branching membrane 40A. Arrow A3 illustrated by a dot-dash line in FIG. 2 illustrates a returning light of the reflected light. A portion of the reflected light is not propagated downstream on the optical transmission line L via the output fiber 31B but is propagated, as the returning light, from the GRIN lens 40 to airspace on a PD-module 20 side.

With the photodetector 10, to suppress this returning light from reaching the light-receiving surface 21A, the PD module 20 is disposed at a certain interval from the GRIN lens 40. By the PD module 20 and the GRIN lens 40 being separated, on the PD-module 20 side, a certain distance is provided between the proper transmitted light and the returning light. Because of this, the PD module 20 can selectively receive the proper transmitted light at the light-receiving surface 21A. The proper transmitted light referred to here refers to the transmitted light from the branching membrane 40A of the input light intentionally guided to the light-receiving surface 21A that is not the returning light or other stray light.

Furthermore, to suppress the returning light and the other stray light from being received at the light-receiving surface 21A, an aperture wall 65 having an opening portion 65A is provided optionally between the GRIN lens 40 and the PD module 20. This opening portion 65A of the aperture wall 65 is provided in a position corresponding to a normal optical path of the transmitted light and suppresses light not arriving from the normal optical path of the transmitted light from being received at the light-receiving surface 21A.

Furthermore, the prism 50 is provided to decrease an incidence angle of the input light at an interface of the input light (transmitted light) reaching the light-receiving surface 21A of the PD chip 21. Specifically, the prism 50 is provided to decrease an incidence angle at an interface INT1 between an air layer, corresponding to an internal space between the GRIN lens 40 and the PD module 20, and the transparent resin layer 25 of the PD module 20 and an incidence angle at an interface INT2 between the transparent resin layer and the PD chip 21. A function of the prism 50 is described below.

The tubular case 60 is configured to house and hold therein the PD module 20, the optical fiber pigtail 30, the GRIN lens 40, and the prism 50 described above. The tubular case 60 can be configured by combining several components. For example, the tubular case 60 may be configured by linking tubular components of the same diameter in an axial direction. The aperture wall 65 can be configured as a portion of the tubular case 60.

Next, the function of the prism 50 is described. The input light from the input optical fiber 31A includes an s-polarized component and a p-polarized component, but a component ratio thereof is normally not established and fluctuates randomly. Meanwhile, a transmittance of when the light is transmitted through an interface between media with differing refractive indices differs between an s-polarized light and a p-polarized light. The difference in transmittance between the s-polarized light and the p-polarized light at the interface is referred to as PDS (polarization-dependent sensitivity).

Figure 4:
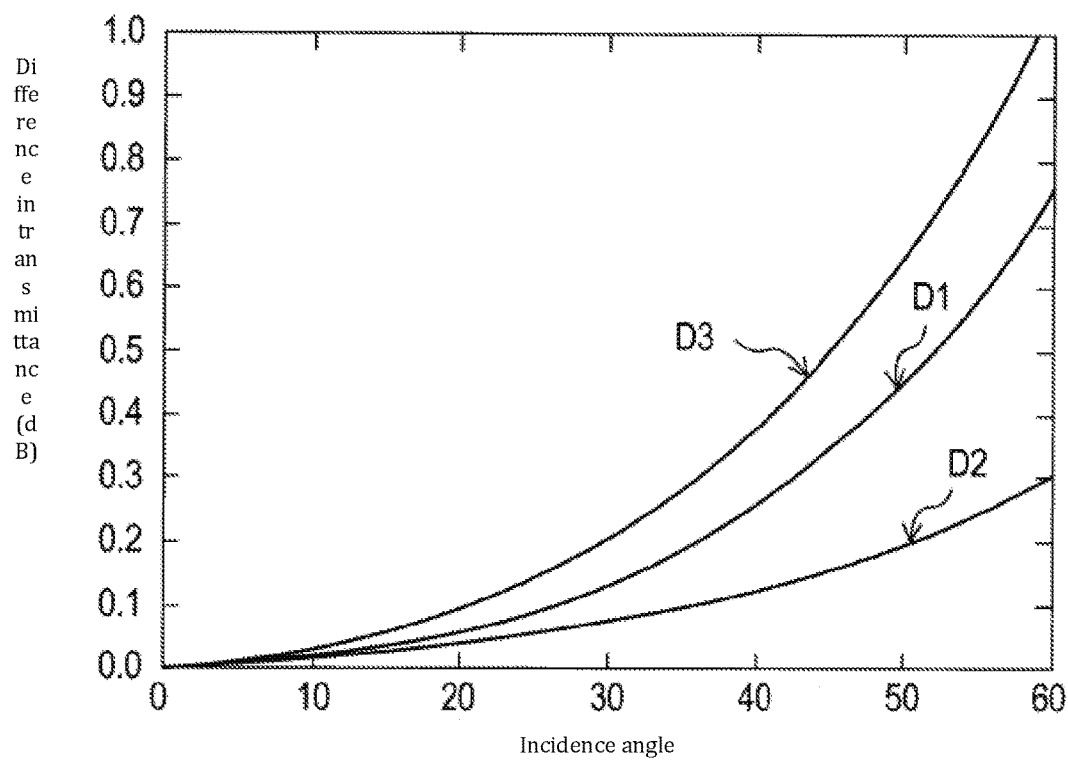
FIG. 4 A graph representing a difference in transmittance between an s-polarized light and a p-polarized light relative to an incidence angle according to one or more embodiments.

The graph in FIG. 4 represents this PDS as the vertical axis and represents the incidence angle at the interface as the horizontal axis. Incidence angle as referred to here refers to an angle relative to a normal line of the interface. Specifically, this graph represents a first PDS that is a PDS at the interface INT1 between the air layer and the transparent resin layer 25 as a curve D1, represents a second PDS that is a PDS at the interface INT2 between the transparent resin layer 25 and the light-receiving surface 21A of the PD chip 21 as a curve D2, and represents a sum of the first PDS and the second PDS as a curve D3. Specifically, this graph represents, in correspondence with the configuration of the photodetector 10 of one or more embodiments, a PDS of when the interface INT1 is an interface between an air layer of a refractive index of n=1 and a transparent resin layer 25 of a refractive index n=1.46 and a PDS of when the interface INT2 is an interface between a transparent resin layer 25 of a refractive index of n=1.46 and a PD chip 21 of a refractive index of n=3.4.

As can be understood from this graph as well, the PDS is greater the greater the incidence angle to the interface is and smaller the smaller the incidence angle to the interface is. Moreover, the PDS is exponential relative to the incidence angle. This signifies that even if a light quantity of the transmitted light heading from the GRIN lens 40 to the transparent reins layer 25 were constant, the greater the incidence angles to the interfaces INT1, INT2, the more the detected power by the PD chip 21 would fluctuate in conjunction with the fluctuation in the component ratio between the s-polarized component and the p-polarized component. Conversely, the fluctuation in the detected power in conjunction with the fluctuation in the component ratio above would be suppressed by making the incidence angle to the interface small. That is, high-precision power detection by the PD module 20 can be realized by making the incidence angle to the interface small.

It is due to such reasons that the prism 50 in one or more embodiments is configured to decrease the incidence angle of the input light at the interfaces INT1, INT2 and is disposed in the path of the input light (transmitted light) from the GRIN lens 40. A designer can determine by desktop calculation or experimentation what type of prism to select and dispose in the path of the input light (transmitted light) to decrease the incidence angles at the interfaces INT1, INT2. As the prism 50, a prism appropriate for decreasing the incidence angle can be selected from among a prism group with differing angles and refractive indices. The prism 50 can be a right-angle prism.

It is sufficient for the prism 50 to be disposed so enabled is power detection at the light-receiving surface 21A with effects due to the PDS suppressed to a greater degree than in a situation where this prism 50 is not disposed; there is no need to dispose the prism 50 so maximum suppression of the influence due to the PDS is achieved.

The designer may select and dispose the prism 50 so, for example, an incidence angle θ at the interface INT1, where the PDS is readily affected by the incidence angle, is made smaller with priority. The prism 50 may be disposed so the incidence angle at each interface INT1, INT 2 is no more than 30 degrees. As can be understood from the graph, this is because the PDS increases rapidly when the incidence angle exceeds 30 degrees.

The prism 50 may be disposed so an incidence angle of the light input to this prism 50 is also no more than 30 degrees. That is, the prism 50 may be disposed so in the path of the input light from the GRIN lens 40 to the light-receiving surface 21A, at each interface to which the input light is propagated, which is not limited to the interfaces INT1, INT2 and includes a surface of the prism 50, the incidence angle at each interface is set to be no more than 30 degrees. At this time, it is understood from the graph that the prism 50 should be disposed by prioritizing decreasing an incidence angle at an interface where the incidence angle is greater than 30 degrees over adjusting an incidence angle at an interface, among a plurality of interfaces in the path, where the incidence angle is small such that the incidence angle becomes smaller.

According to the photodetector 10 of one or more embodiments described above, the prism 50 is disposed to decrease the incidence angle of the input light at the interfaces INT1, INT2 in the path of the input light from the GRIN lens 40 to the light-receiving surface 21A. Specifically, the prism 50 is disposed to decrease the incidence angle of the input light to a surface of the transparent resin layer 25 and to decrease an incidence angle to the light-receiving surface 21A. Therefore, according to this configuration of the photodetector 10, compared to a situation where there is no prism 50, the PDS in the path from the GRIN lens 40 to the light-receiving surface 21A can be decreased overall. As a result, by the fluctuations in the component ratio between the s-polarized component and the p-polarized component of the input light, the detected power can be suppressed from fluctuating even though the power of the input light is constant and the power, which is the object, can be detected with high precision.

Modified Example

Figure 5:
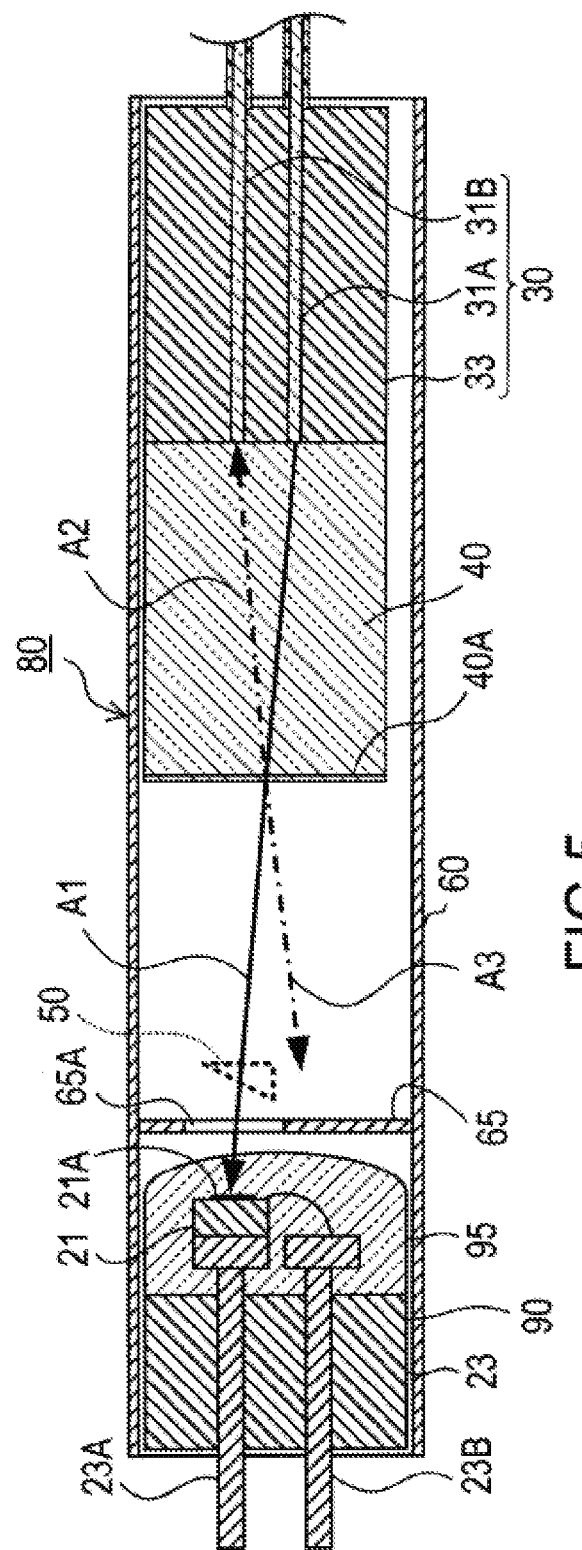
FIG. 5 A diagram schematically representing a cross-sectional structure of a photodetector of a modified example.

Next, a photodetector 80 of a modified example is described. The photodetector 80 of the modified example illustrated in FIG. 5 is provided with a PD module 90 illustrated in FIG. 6 instead of the PD module 20 described above. The photodetector 80 of the modified example may be provided with the prism 50 as illustrated by the dashed line but does not have to be. The photodetector 80 of the modified example can be of the same configuration as the photodetector 10 described above other than being provided with the PD module 90 instead of the PD module 20 and a presence of the prism 50 being optional. Therefore, it may be understood that the photodetector 80 of the modified example is of a configuration where in the photodetector 10 illustrated in FIG. 2 the PD module 90 illustrated in FIG. 6 is provided instead of the PD module 20.

Figure 6:
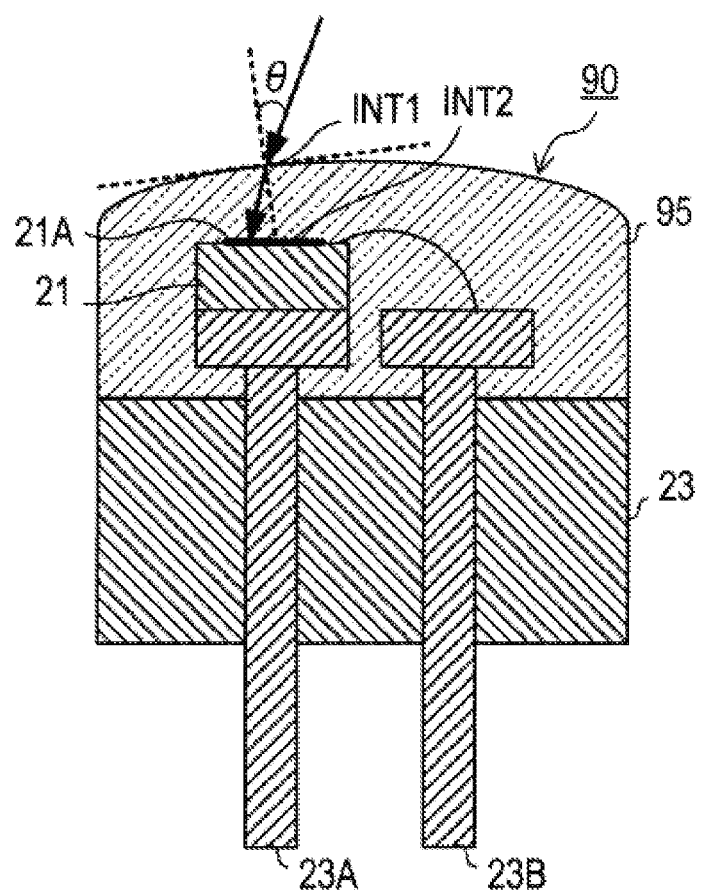
FIG. 6 A cross-sectional view representing a schematic configuration of a PD module of the modified example.

The PD module 90 illustrated in FIG. 6 is configured to be the same as the PD module 20 described above other than a shape of a transparent resin layer 95 being different. It may be understood that areas of the photodetector 80 and the PD module 90 labeled with the same reference signs as those of the photodetector 10 and the PD module 20 are of the same configuration as corresponding areas of the photodetector 10 and the PD module 20.

Compared to the transparent resin layer 25, this PD module 90 has a surface of the transparent resin layer 95 shaped to be flat; an incidence angle θ of the input light at the surface of the transparent resin layer 95 is decreased compared to an incidence angle at the transparent resin layer 25 in a situation where the prism 50 is not present.

The transparent resin layer 95 is disposed opposing the GRIN lens 40. The input light reaches the surface of the transparent resin layer 95 from the air layer between the transparent resin layer 95 and the GRIN lens 40. Because of this, the incidence angle of the input light to the transparent resin layer 95 is decreased if a curvature of the transparent resin layer 95 is decreased, the transparent resin layer 95 is flattened along the surface of the stem 23, and, by this, a normal-line direction relative to the surface of the transparent resin layer 95 is brought closer to a centerline of the photodetector 80.

The PDS is also decreased by shaping the surface of the transparent resin layer 95 in this manner to decrease the incidence angle, and as a result, a power-detection precision of the photodetector improves. In a situation where the prism 50 is not disposed, no interface increase arises due to the disposition of the prism 50; therefore, there is a possibility of more efficiently suppressing the influence of the PDS.

Figure 7:
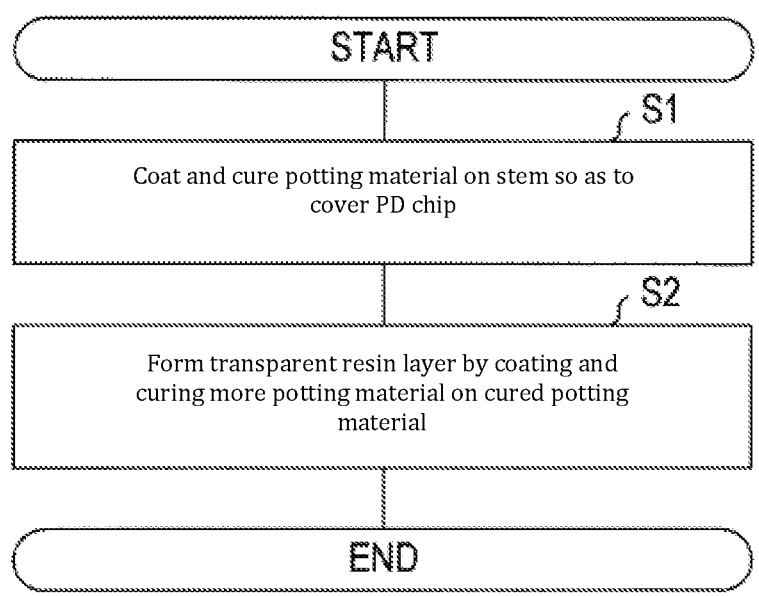
FIG. 7 A flowchart representing a forming procedure of a transparent resin layer according to one or more embodiments.

In other words, the transparent resin layer 95 can be formed by coating a plurality of layers of the potting material. That is, as illustrated in FIG. 7, the transparent resin layer 95 can be formed via a step S1 of coating and curing the potting material on the stem 23 so as to cover the PD chip 21 and a step S2 of coating and curing more potting material on the cured potting material. The potting materials used at each step may be the same potting material or potting materials having differing surface tensions. By this procedure, the surface of the transparent resin layer 95 is shaped so the incidence angle of the input light becomes no more than 30 degrees.

[Other]
Illustrative embodiments of the present invention are described above, but the present invention is not limited to the embodiments above and may adopt various aspects. For example, the photodetectors 10, 80 are not limited to use in an optical communication device. The GRIN lens 40 may be replaced with another collimating lens. For example, the GRIN lens 40 may be replaced with an aspherical lens.

The PD module 20 may be a PD module of another type—for example, a TO (CAN) type. For incremental angle adjustment, a plurality of prisms 50 may be provided in the propagation path of the input light. Another optical component that can adjust the incidence angle may be provided instead of or in addition to the prism 50. Shaping of the transparent resin layer 95 may be realized by machining.

A function had by one component in the embodiments above may be provided dispersed between a plurality of components. A function had by a plurality of components may be integrated into one component. A portion of the configuration of the embodiments above may be omitted. At least a portion of the configuration of an embodiment above may be added to or replace the configuration of another embodiment above. All aspects included within the technical idea specified from the wording given in the scope of patent claims are embodiments of the present disclosure.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . optical communication device; 10 . . . photodetector; 20 . . . PD module; 21 . . . PD chip; 21A . . . light-receiving surface; 23 . . . stem; 23A, 23B . . . electrode pin; 25 . . . transparent resin layer; 30 . . . optical fiber pigtail; 31A, 31B . . . optical fiber; 33 . . . capillary; 40 . . . GRIN lens; 40A . . . branching membrane; 50 . . . prism; 60 . . . tubular case; 80 . . . photodetector; 90 . . . PD module; 95 . . . transparent resin layer; INT1, INT2 . . . interface; L, L1, L2 . . . optical transmission line.

What is claimed is:

1. A detection device that detects a power of an input light, comprising:
   a light-receiving module comprising: a light-receiving surface and a transparent covering body covering the light-receiving surface, wherein the light receiving module:
      receives the input light that arrives via the transparent covering body, at the light-receiving surface, and
      outputs an electrical signal according to the power of the received input light; and
   an optical lens that collimates and guides to the light-receiving surface the input light from an outside; wherein
      the transparent covering body is shaped so an incidence angle of the input light at a surface thereof becomes no more than 30 degrees.

2. The detection device according to claim 1, wherein
   the input light is an optical communication signal;
   the detection device further comprises an optical fiber pigtail including two optical fibers connected to an optical transmission line through which the optical communication signal is transmitted;
   the optical lens collimates the input light from one end of one of the two optical fibers, separates the input light into a transmitted light and a reflected light, guides the transmitted light to the light-receiving surface, and guides the reflected light as output to the other of the two optical fibers; and
   the light-receiving module outputs the electrical signal according to the power of the input light that is the input light from the optical transmission line via the input fiber and received at the light-receiving surface.

3. A manufacturing method of a detection device that detects a power of an input light, the detection device comprising a light-receiving module that includes a light-receiving element, a support body that supports the light-receiving element, and a transparent covering body that covers the light-receiving element on the support body and an optical lens that collimates and guides to a light-receiving surface of the light-receiving element the input light from an outside, the manufacturing method comprising:
   coating a potting material on the light-receiving element on the support body to form a coating body;
   coating a plurality of layers of the potting material to form the transparent covering body to have a surface shaped so an incidence angle of the input light to the transparent covering body becomes no more than 30 degrees.

* * * * *